(12) United States Patent
Suenaga et al.

(10) Patent No.: US 6,799,539 B2
(45) Date of Patent: Oct. 5, 2004

(54) SYSTEM AND METHOD FOR UTILIZATION OF WASTE HEAT OF SEMICONDUCTOR EQUIPMENT AND HEAT EXCHANGER USED FOR UTILIZATION OF WASTE HEAT OF SEMICONDUCTOR EQUIPMENT

(75) Inventors: Osamu Suenaga, Nirasaki (JP); Sadao Kobayashi, Tokyo (JP)

(73) Assignees: Tokyo Electron Limited (JP); Taisei Corporation (JP)

( * ) Notice: Subject to any disclaimer, the term of this patent is extended or adjusted under 35 U.S.C. 154(b) by 0 days.

(21) Appl. No.: 10/468,362
(22) PCT Filed: Feb. 15, 2002
(86) PCT No.: PCT/JP02/01315
§ 371 (c)(1),
(2), (4) Date: Aug. 20, 2003
(87) PCT Pub. No.: WO02/067308
PCT Pub. Date: Aug. 29, 2002

(65) Prior Publication Data
US 2004/0074451 A1 Apr. 22, 2004

(30) Foreign Application Priority Data
Feb. 20, 2001 (JP) .................................. 2001-044217

(51) Int. Cl.[7] .............................................. F22D 1/02
(52) U.S. Cl. ......................... 122/7 R; 165/47; 165/909
(58) Field of Search .............................. 122/7 R, 20 B, 122/31.1, 32, 421, 470; 165/47, 909, 108

(56) References Cited

U.S. PATENT DOCUMENTS

| | | | | |
|---|---|---|---|---|
| 4,074,660 A | * | 2/1978 | Tsao .............................. | 122/32 |
| 4,336,770 A | * | 6/1982 | Kaneko et al. .............. | 122/266 |
| 4,589,473 A | * | 5/1986 | Kehrer ......................... | 165/160 |
| 4,718,481 A | * | 1/1988 | Delatte ........................ | 165/108 |
| 5,452,686 A | * | 9/1995 | Stahl .......................... | 122/135.1 |
| 6,167,891 B1 | * | 1/2001 | Kudelka et al. .............. | 134/1.3 |

FOREIGN PATENT DOCUMENTS

| | | |
|---|---|---|
| JP | 02-139082 A | 5/1990 |
| JP | 08-261676 A | 10/1996 |
| JP | 2000-266496 A | 9/2000 |

* cited by examiner

Primary Examiner—Gregory A. Wilson
(74) Attorney, Agent, or Firm—Finnegan, Henderson, Farabow, Garrett & Dunner, LLP (57) ABSTRACT

An amount of energy consumption in a semiconductor fabrication facility can be reduced by using cooling water drained from a semiconductor fabrication apparatus as a heat source of another semiconductor fabrication apparatus. Cooling water of 80° C. drained from a heating furnace of a heat processing apparatus (10) is supplied to a deionized water heating apparatus (32) of a cleaning apparatus (30). The deionized water heating apparatus (32) raises a temperature of deionized water of a room temperature to 60° C. through heat exchange with the cooling water of 80° C. The cooling water, whose temperature falls to 30° C. after the heat exchange, is reutilized for cooling of the heating furnace (12).

8 Claims, 4 Drawing Sheets

SYSTEM AND METHOD FOR UTILIZATION OF WASTE HEAT OF SEMICONDUCTOR EQUIPMENT AND HEAT EXCHANGER USED FOR UTILIZATION OF WASTE HEAT OF SEMICONDUCTOR EQUIPMENT

TECHNICAL FIELD

The present invention relates to a utilization technique of waste heat of a semiconductor fabrication apparatus, and more particularly to system and method for utilization of waste heat that reutilize heat of cooling water drained from a semiconductor fabrication apparatus as a heat source of another semiconductor fabrication apparatus, and a heat exchanger used in the system for utilization of waste heat.

BACKGROUND ART

A semiconductor fabrication facility includes a variety of semiconductor fabrication apparatuses used in semiconductor fabrication steps. In general, these semiconductor fabrication apparatuses are accommodated in a clean room. Accordingly, when heat is released from a semiconductor fabrication apparatus to its surrounding area, there occurs a temperature increase within the clean room. For this reason, cooling water is supplied to each semiconductor fabrication apparatus so as to prevent heat release to atmosphere in the clean room.

Among such semiconductor fabrication apparatuses, there is a heat processing apparatus, which has a heating furnace to process a semiconductor wafer at a high temperature (about 1000° C.). Since a large amount of heat is released from a heating furnace to its surrounding area, cooling water is used to cool the surrounding area by absorbing the heat. Accordingly, a large amount of cooling water (for example, which has a temperature of 23° C.) is supplied to a heat processing apparatus including a heating furnace under control of the cooling water so that the temperature of the cooling water drained from the heat processing apparatus can be about 30° C.

Among the semiconductor fabrication apparatuses, there is also an apparatus having a heat source for heat processing. For instance, a wafer cleaning apparatus serves to clean a wafer by using deionized water (DIW) heated to 60° C. through 80° C., and contains a heat source to heat the deionized water. Namely, before deionized water of a room temperature (for example, 23° C.) is supplied to the wafer cleaning apparatus to clean a wafer, the deionized water is heated to 60° C. through 80° C. by an electronic heater and so on.

As mentioned above, a large amount of heat is released to the exterior of a semiconductor fabrication facility via cooling water drained from the heat processing apparatus. In order to supply cooling water to a heat processing apparatus, power for circulating the cooling water and energy for cooling the heated cooling water again are required.

On the other hand, a wafer cleaning apparatus needs a large amount of heat for heating deionized water. Since an electronic heater is used to heat the deionized water, it is necessary to supply a large amount of electric power to the wafer cleaning apparatus.

In the semiconductor fabrication facility, a large amount of energy is consumed for cooling of a heat processing apparatus and heating of a wafer cleaning apparatus. From the viewpoint of energy saving, therefore, the semiconductor fabrication facility is wasteful in that energy is consumed for the cooling and the heating separately.

DISCLOSURE OF INVENTION

It is an object of the present invention to provide improved and useful system and method for utilization of waste heat in which the above-mentioned problems are eliminated.

A more specific object of the present invention is to provide system and method for utilization of waste heat that can reduce an amount of total energy consumption of a semiconductor fabrication facility by using cooling water drained from a semiconductor fabrication apparatus as a heat source of another semiconductor fabrication apparatus, and a heat exchanger for such a system for utilization of waste heat.

In order to achieve the above-mentioned objects, there is provided according to one aspect of the present invention a system for utilization of waste heat of a semiconductor fabrication apparatus, including: a heat processing apparatus being cooled by cooling water; a cleaning apparatus performing a cleaning process by using heated deionized water; a deionized water heating apparatus heating the deionized water used by the cleaning apparatus; a cooling water supply line supplying cooling water to the heat processing apparatus; a cooling water reutilization line supplying cooling water drained from the heat processing apparatus to the deionized water heating apparatus; and a cooling water recovery line recovering cooling water drained from the deionized water heating apparatus, wherein the deionized water heating apparatus heats deionized water through heat exchange with the cooling water supplied from the cooling water reutilization line.

The above-mentioned system may further include a cooling water circulation line coupling between the cooling water supply line and the cooling water recovery line. In addition, the system may further include circulation stop means for stopping flow of cooling water toward the cooling water circulation line when a temperature of the cooling water in the cooling water recovery line exceeds a predetermined temperature. In addition, in the above-mentioned system, the circulation stop means may include: a first switching valve being provided along the cooling water recovery line; a second switching valve being provided along the cooling water circulation line; and a temperature sensor detecting a temperature of cooling water in the cooling water supply line, wherein the first switching valve may be opened and the second switching valve may be closed when the temperature of the cooling water detected by the temperature sensor exceeds the predetermined temperature. In addition, in the above-mentioned system, the deionized water heating apparatus may include a contact portion with deionized water, the contact portion being formed of one of quartz glass and fluorosis resin.

Additionally, there is provided according to another aspect of the present invention a method for utilization of waste heat in a semiconductor fabrication facility having a heat processing apparatus and a cleaning apparatus, the method including the steps of: supplying to a deionized water heating apparatus cooling water drained from the heat processing apparatus after cooling for the heat processing apparatus; supplying deionized water to the deionized water heating apparatus, heating the deionized water through heat exchange with the cooling water, and supplying the heated deionized water to the cleaning apparatus; and recovering the cooling water drained from the deionized water heating apparatus.

The above-mentioned method may further include the step of supplying the cooling water drained from the deionized water heating apparatus to the heat processing apparatus directly. In addition, the method may further include the step of stopping supplying the cooling water drained from the deionized water heating apparatus to the heat processing apparatus when a temperature of the cooling water drained from the deionized water heating apparatus exceeds a predetermined temperature.

According to the above-mentioned inventions, cooling water (warm cooling water) heated by a heat processing apparatus and drained therefrom is supplied to a deionized water heating apparatus. The deionized water heating apparatus, which is a heat exchanger, heats deionized water of a low temperature (room temperature) through heat exchange with the warm cooling water drained from the heat processing apparatus and then supplies the heated deionized water to a cleaning apparatus. As a result, it is possible to heat the deionized water, which is conventionally heated by an electronic heater or the like, by using heat of the warm cooling water. Therefore, it is possible to reutilize heat from the heat processing apparatus, which is conventionally discarded via cooling water, as a heat source for the deionized water.

Additionally, there is provided according to another aspect of the present invention a heat exchanger for heating deionized water supplied to a semiconductor fabrication apparatus, including: a cooling water channel where warm cooling water, that is, heated cooling water, is supplied; and a deionized water channel where deionized water is supplied, the deionized water channel being formed of one of quartz glass and fluorosis resin, wherein heat is exchanged between the warm cooling water in the cooling water channel and the deionized water in the deionized water channel.

Other objects, features and advantages of the present invention will become more apparent from the following detailed description when read in conjunction with the accompanying drawings.

BEST MODE FOR CARRYING OUT THE INVENTION

A description is given, with reference to the accompanying drawings, of embodiments of the present invention wherein the same components in the drawings are designated by the same reference numerals.

A description is given of a semiconductor fabrication apparatus used in a system for utilization of waste heat according to an embodiment of the present invention. In the system for utilization of waste heat according to this embodiment, heat of heated cooling water (warm cooling water) drained from a semiconductor fabrication apparatus is used as a heat source of another semiconductor fabrication apparatus. In this embodiment, a vertical heat processing apparatus is used as the former semiconductor fabrication apparatus that drains the warm cooling water to be reutilized, and a cleaning apparatus having a deionized water heating apparatus is used as the latter semiconductor fabrication apparatus that reutilizes the cooling water.

Figure 1:
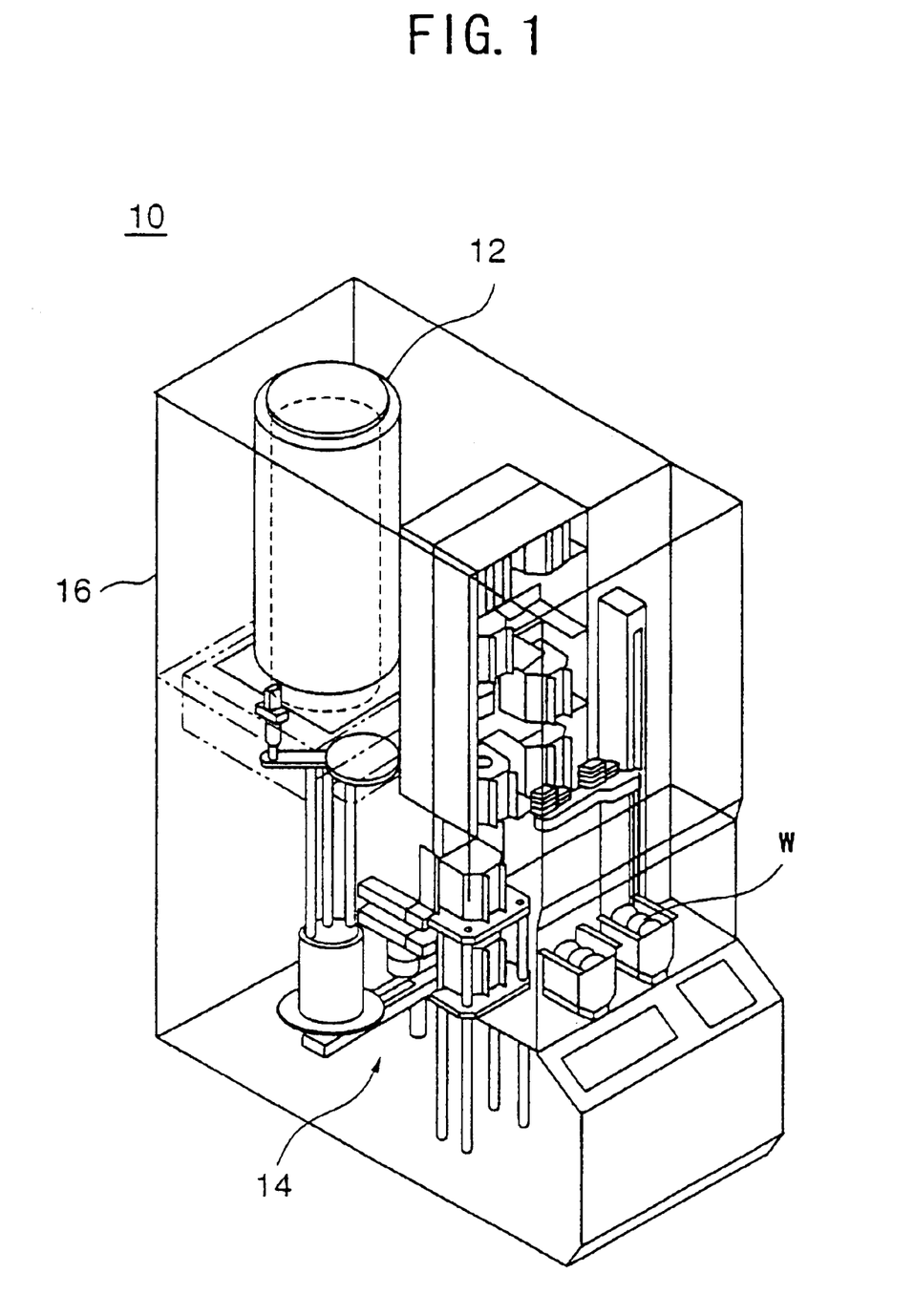
FIG. 1 is a perspective view of a vertical heat processing apparatus.

FIG. 1 is a perspective view of a vertical heat processing apparatus. A vertical heat processing apparatus 10 shown in FIG. 1 comprises a heating furnace 12 for performing heat treatment on a semiconductor wafer (W) at about 1000° C., and a carrier mechanism 14 that inserts/ejects a semiconductor wafer into/from the heating furnace 12. The heating furnace 12 and the carrier mechanism 14 are accommodated in a housing 16, which work together as a heat processing apparatus.

Figure 2A:
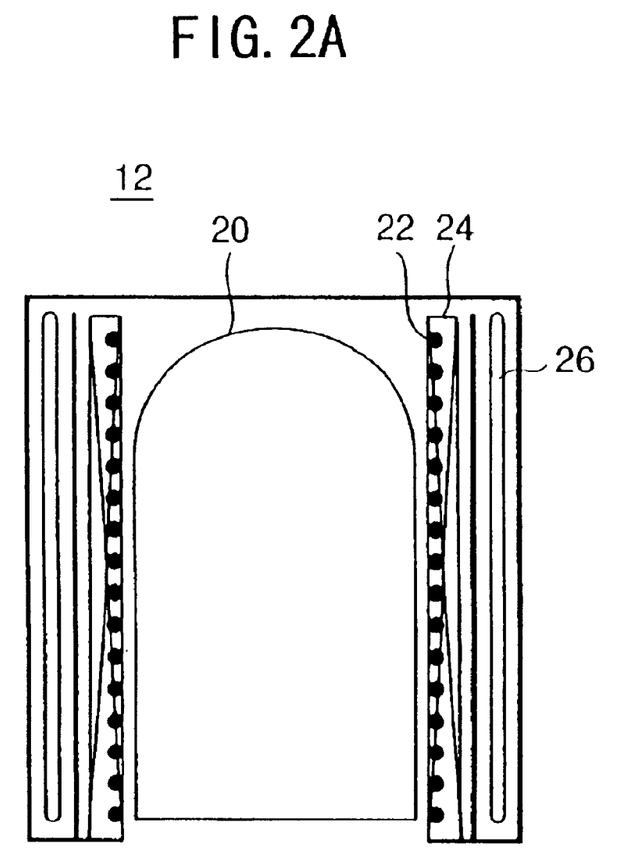
FIG. 2A is a schematic cross-sectional view of a heating furnace of the vertical heat processing apparatus in FIG. 1.
Figure 2B:
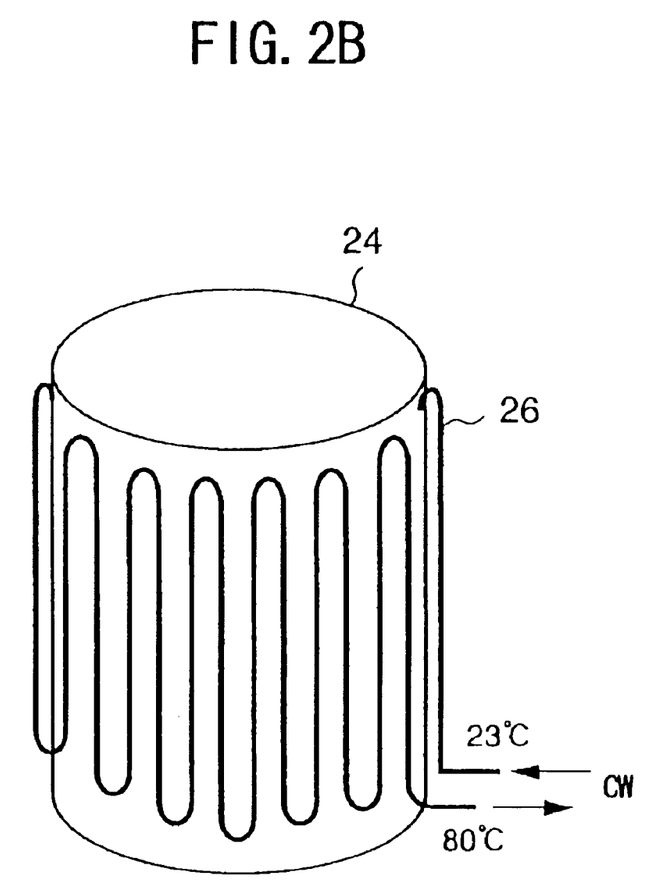
FIG. 2B is a diagram schematically illustrating flow of cooling water in the vicinity of the heating furnace.

FIG. 2A is a schematic cross-sectional view of the heating furnace 12 of the vertical heat processing apparatus 10 shown in FIG. 1. FIG. 2B is a diagram schematically illustrating flow of cooling water in the surrounding area of the heating furnace 12. As shown in FIG. 2A, a wafer accommodation body 20 for accommodating a semiconductor wafer therein is provided within the heating furnace 12, and an electronic heater 22 is disposed in the surrounding area of the wafer accommodation body 20. In order to prevent heat generated by the electronic heater 22 from being released to the exterior, a heat insulation body 24 is provided in the electronic heater 22.

However, since the heating temperature of the electronic heater 22 reaches about 1000° C., it is impossible to totally insulate the heat by using only the heat insulation body 24. For this reason, a cooling pipe 26 is provided in the surrounding area of the heat insulation body 24, and cooling water (CW) is sent along the cooling pipe 26, thereby absorbing the heat that should be released from the heat insulation body 24 to the exterior.

As shown in FIG. 2B, the cooling pipe 26 is arranged to fully cover the outer circumference of the heat insulation body 24. Since the heating temperature of the electronic heater 22 rises as high as about 1000° C., the outer circumference of the heat insulation body 24, on which the cooling pipe 26 is provided, also reaches a temperature above 80° C. As a result, it is possible to raise the cooling water, which is drained after cooling of the heating furnace 12, between 60° C. and 80° C. The system according to the embodiment controls the cooling water drained from the heat processing apparatus 10 so that the temperature of the cooling water can be higher than that of cooling water drained from conventional heat processing apparatuses. As a result, it becomes possible to use heat of the cooling water in another semiconductor apparatus.

In the system according to the embodiment, a wafer cleaning apparatus is used as a semiconductor fabrication apparatus that reutilizes high-temperature cooling water drained from the heat processing apparatus 10. The wafer cleaning apparatus comprises a cleaning tank, and deionized water is used to clean a wafer in the cleaning tank. In order to increase cleaning effect, the ionized water is heated between 60° C. and 80° C. For this purpose, the wafer cleaning apparatus comprises a deionized water generation apparatus that generates deionized water, and a deionized water heating apparatus that heats deionized water of a room temperature (for example, 23° C.) between 60° C. and 80° C. The deionized water heating apparatus may use an electronic heater or other means as a heat source thereof. However, since the deionized water has a relatively low temperature between 60° C. and 80° C., it is possible to use a heat exchanger to satisfactorily raise the temperature of the deionized water to the above temperature range. Thus, the deionized water heating apparatus can be configured from a heat exchanger, thereby heating deionized water through heat exchange with cooling water drained from the above-mentioned vertical heat processing apparatus.

According to the above-mentioned system for utilization of waste heat, heat released from the heat processing apparatus 10 is utilized as a heat source of the deionzied water heating apparatus in consideration of some conditions. Hence, warm cooling water, which is conventionally adjusted at about 30° C., from a heat processing apparatus is controlled between 60° C. and 80° C., and the warmer cooling water is supplied to a deionized water heating apparatus so as to heat deionized water between 60° C. and 80° C.

In addition, a wafer cleaning apparatus is usually disposed adjacently to a heat processing apparatus. From this viewpoint, it can be also considered that a combination of a heat processing apparatus and a cleaning apparatus optimally configures a system for utilization of waste heat according to the present invention.

Figure 3:
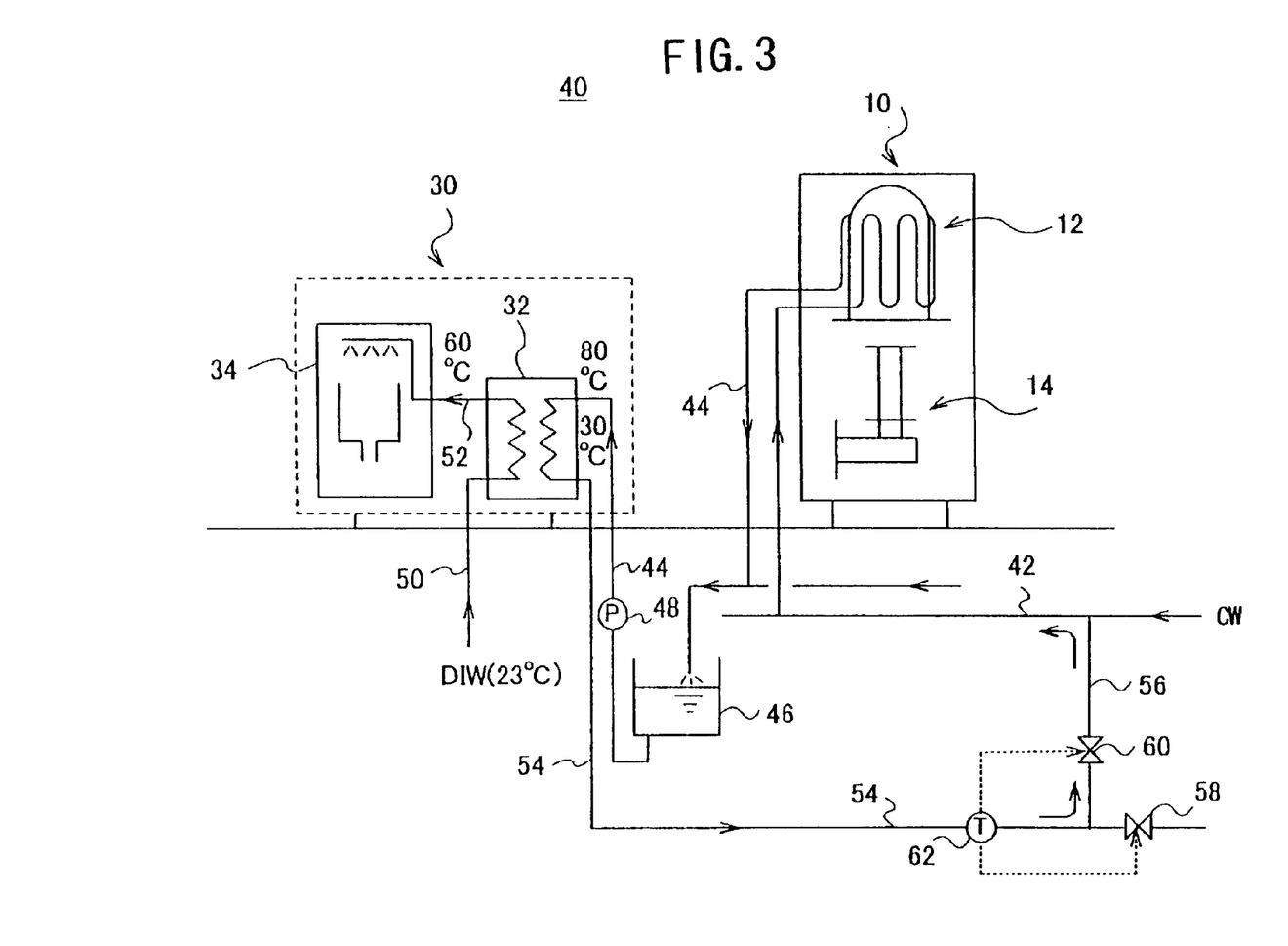
FIG. 3 is a diagram illustrating a whole structure of a system for utilization of waste heat according to an embodiment of the present invention.

FIG. 3 is a diagram illustrating a whole structure of a system for utilization of waste heat according to an embodiment of the present invention. As mentioned above, an exemplary system 40 for utilization of waste heat comprises a vertical heat processing apparatus 10 (which is referred to as a heat processing apparatus hereinafter) and a wafer cleaning apparatus 30 (which is referred to as a cleaning apparatus hereinafter).

As shown in FIG. 3, cooling water of a room temperature (for example, 23° C.) is supplied to the surrounding area of the heating furnace 12 of the heat processing apparatus 10 via a cooling water supply line 42. The cooling water absorbs heat released from the heating furnace 12 to the surrounding area, resulting in making the surrounding area of the heating furnace 12 cool. As a result, the temperature of the cooling water increases. However, the temperature of the cooling water is kept at 80° C. by adjusting a flow volume of the cooling water. Hence, the heat processing apparatus can drain the cooling water whose temperature rises to 80° C.

Then, the warm cooling water of 80° C. drained from the heat processing apparatus 10 is supplied to a deionized water heating apparatus 32 in the cleaning apparatus 30 via a cooling water reutilization line 44. On the way to the cooling water reutilization line 44, a warm cooling water tank 46 for temporarily storing the warm cooling water of 80° C. and a pump 48 for supplying the warm cooling water in the warm cooling water tank to the cleaning apparatus 30 may be provided. The warm cooling water tank 46 is prepared, while the cleaning apparatus 30 does not operate, for temporary storage of the warm cooling water of 80° C. until the cleaning apparatus 30 starts.

On the other hand, deionized water of a room temperature (for example, 23° C.) is supplied to the deionized water heating apparatus 32 of the cleaning apparatus 30 via a deionized water supply line 50. The deionized water heating apparatus 32 includes a heat exchanger to exchange heat between the warm cooling water of 80° C. and the deionized water of 23° C. This heat exchange raises the temperature of the deionized water of 23° C. to 60° C., and the heated deionized water is supplied to a cleaning tank 34 of the cleaning apparatus 30 via a warm deionized water supply line 52.

After supplying the warm cooling water to the deionized water heating apparatus (heat exchanger) 32, on the other hand, the temperature of the warm cooling water of 80° C. falls to 30° C. through heat release to the deionized water due to the heat exchange. The warm cooling water of 30° C. is recovered by the cleaning apparatus 30 via a cooling water recovery line 54.

The cooling water of 30° C. recovered via the cooling water recovery line 54 is delivered to a main cooling water recovery line of the semiconductor fabrication facility and then is used as cooling water of a lowered temperature (for example, 23° C.). However, the cooling water of 30° C. is directly delivered back to the heating furnace 12 so as to cool the heating furnace 12 of the heat processing apparatus 10 during operation of the heat processing apparatus 10. Hence, a cooling water circulation line 56 is provided between the cooling water supply line 42 and the cooling water recovery line 54, and the warm cooling water of 30° C. in the cooling water recovery line 54 is delivered back to the cooling water supply line 42 via the cooling water circulation line 56.

A first switching valve 58 is provided at the downstream side of the cooling water recovery line 54 from the cooling water circulation line 56, and also, a second switching valve 60 is provided along the cooling water circulation line 56. In a case where the warm cooling water is delivered back to the heat processing apparatus 10 for cooling of the heating furnace 12 again, the switching valve 58, which is disposed along the cooling water recovery line 52, is closed, whereas the second switching valve 60, which is disposed along the cooling water circulation line 56, is opened. In this case, the cooling water of 30° C. in the cooling water recovery line 54 is delivered back to the cooling water supply line 42 via the cooling water circulation line 56 for cooling of the heating furnace 12 of the heat processing apparatus 10 again.

The temperature of the cooling water in the cooling water recover line 54 is detected by a temperature sensor 62, and the first and second switching valves 58 and 60 are controlled based on detection by the temperature sensor 62.

During operation of the cleaning apparatus 30, that is, during operation of the deionized water heating apparatus 32, hot cooling water (80° C.) drained from the heat processing apparatus 10 is cooled to 30° C. through heat exchange performed by the deionized water heating apparatus 32, and then is recovered via the cooling water recovery line 54. As a result, it is possible to reuse the cooling water of 30° C. in the cooling water recovery line 54 for cooling of the heating furnace 12 again.

On the other hand, during operation of the deionized water heating apparatus 32, although hot cooling water drained from the heat processing apparatus 10 is supplied to the deionized water heating apparatus 32, the hot cooling water is drained from the deionized water heating apparatus 32 at the unchanged temperature and then is recovered via the cooling water recover line 54. In this case, since the temperature of the cooling water in the cooling water recovery line 54 is 80° C., it is impossible to use the cooling water for cooling of the heating furnace 12. Thus, once a temperature detected by the temperature sensor 62, which is provided along the cooling water recovery line 54, reaches a predetermined temperature above 30° C., for example, 40° C., the first switching valve 58 is opened and the second switching valve 60 is closed. In this case, the cooling water of 80° C. in the cooling water recovery line 54 is not delivered to the cooling water circulation line 56 but the main cooling water recovery line of the semiconductor fabrication facility.

Here, the system for utilization of waste heat shown in FIG. 3 comprises one heat processing apparatus 10 and one cleaning apparatus 30. However, an exemplary system according to the present invention may be configured from a plurality of heat processing apparatuses and a plurality of cleaning apparatuses. The inventors found that when an embodied system according to the present invention, which is based on heat budget calculation, is configured, for example, from five vertical heat processing apparatuses per one cleaning apparatus, the system makes it possible to achieve a good balance between a heat amount released from the heat processing apparatuses and a heat amount used by the cleaning apparatus. Consequently, a system for utilization of waste heat according to the present invention was experimentally applied to a semiconductor fabrication facility configured from 12 cleaning apparatuses and 60 heat processing apparatuses, and the heat budget was measured. From this experiment, it was found that the heat amount of 2.5 million KWh/year can be saved.

In detail, the heat amount of 1.55 KWh/year can be saved if deionized water is heated through heat exchange instead of a conventional electronic heater, and the heat amount of 0.95 million KWh/year can be saved if cooling water from deionized water heating apparatuses is reused for cooling of heating furnaces. As a result, the embodied system according to the present invention can save the amount of energy consumption (1.55+0.95=2.50 KWh/year).

According to the above-mentioned system for utilization of waste heat, cooling water (warm cooling water) heated by the heat processing apparatus 10 and drained therefrom is supplied to the deionized water heating apparatus 32. The deionized water heating apparatus 32, which comprises a heat exchanger, heats deionized water of a low temperature (room temperature) through heat exchange with the warm cooling water drained from the heat processing apparatus 10 and then supplies the heated deionized water to the cleaning tank 34. Accordingly, it is possible to heat deionized water, which is conventionally heated by an electronic heater or the like, by using heat of the warm cooling water, thereby reutilizing heat from the heat processing apparatus 10, which is conventionally discarded via the cooling water, as a heat source of the deionized water.

In addition, cooling water for cooling the heat furnace 12 of the heat processing apparatus 10 is supplied thereto at 23° C. and then is drained therefrom at 80° C. Thus, the temperature difference (80−23=57° C.) of the cooling water is much greater than a conventional temperature difference (30−23=7° C.). As a result, it is possible to improve cooling efficiency of the heating furnace 12 and reduce a flow volume of the cooling water to be supplied to the heating furnace 12.

A description is given of a structure of the deionized heating apparatus 32 according to an embodiment of the present invention. Here, although the deionized water heating apparatus 32 in FIG. 3 is provided in the interior of the cleaning apparatus 30, the deionized water heating apparatus 32 may be disposed in the exterior of the cleaning apparatus 30 and in the vicinity of the cleaning apparatus 30.

Figure 4:
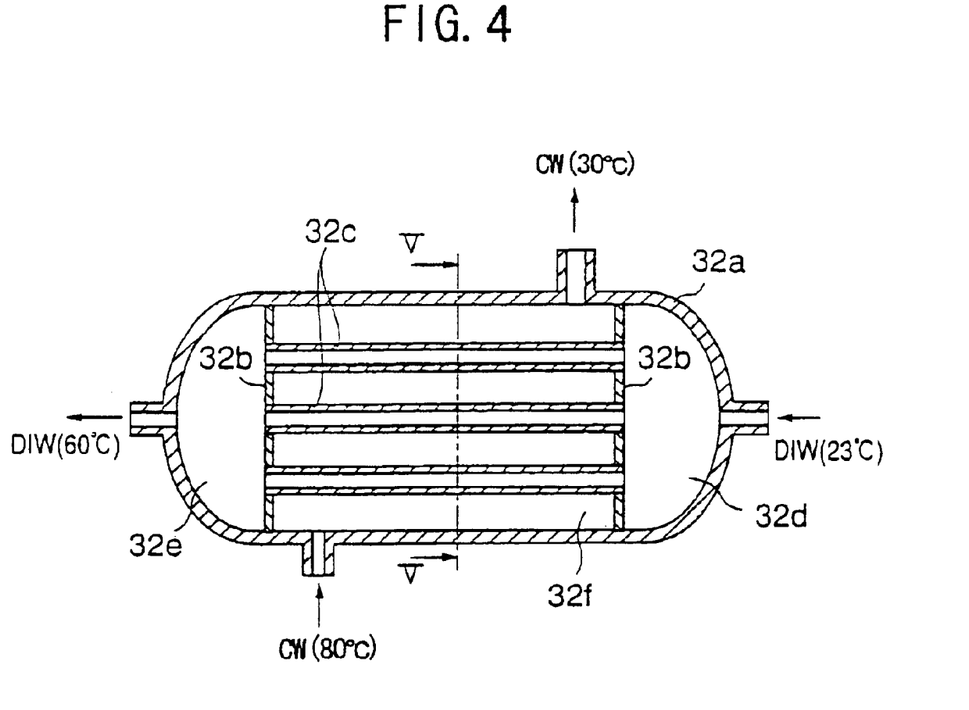
FIG. 4 is a cross-sectional view of a deionized water heating apparatus.
Figure 5:
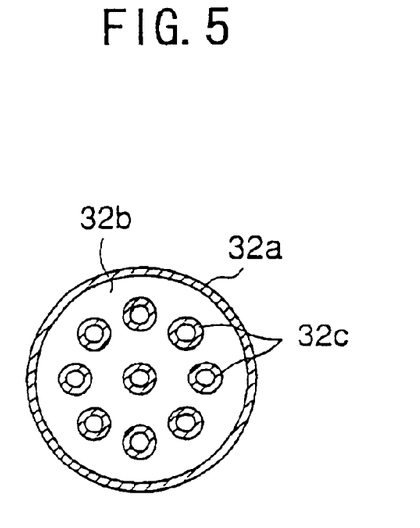
FIG. 5 is a cross-sectional view of the deionized water heating apparatus with respect to the V—V line in FIG. 4.

FIG. 4 is a cross-sectional view of an exemplary deionized water heating apparatus 32. FIG. 5 is a cross-sectional view of the deionized water heating apparatus 32 with respect to the V—V line in FIG. 4. The deionized water heating apparatus 32 is a heat exchanger and comprises a common heat exchanger. In a heat exchanger according to the present invention, however, it is necessary to use a particular material. a contact portion of the heat exchanger with deionized water has to be formed of a material that cannot contaminate the deionized water. Preferably, quartz glass and very pure fluorosis resin such as PFA and PTFA are used as a material that cannot contaminate deionized water.

The deionized water heating apparatus 32 shown in FIG. 4 comprises a body 32a formed of quartz glass or very pure fluorosis resin, two partition walls 32b provided in the body 32a, and a plurality of heat exchange pipes 32c provided between the two partition walls 32b. Here, the two partition walls 32b and the heat exchange pipes 32c are also formed of quartz glass or very pure fluorosis resin.

Deionized water (DIW) of a room temperature (23° C.) is supplied to the interior of the body 32a via a feed opening of the body 32a. The deionized water is provided in an area 32d defined by the inner wall of the body 32a and the partition wall 32b. Then, the deionized water passes through the plurality of heat exchange pipes 32c, reaches an area 32e defined by the inner wall of the body 32a and the partition wall 23b, and drained from the body 32a via an exhaust opening of the body 32a. On the other hand, cooling water of a high temperature (80° C.) is supplied from a cooling water feed opening of the body 32a to an area 32f defined between the inner wall of the body 32a and the two partition walls 32b and then is drained from a cooling water exhaust opening of the body 32a.

In this configuration, while deionized water of 23° C. is flowing in the heat exchange pipes 32c, heat is exchanged between the deionized water and cooling water of 80° C. flowing in the surrounding area of the heat exchange pipes 32c, and then the deionized water is drained as the deionized water of 60° C. On the other hand, the cooling water of 80° C. is drained as the cooling water of 30° C. by providing heat to the deionized water. In addition, since the body 32a, the partition walls 32b and the heat exchange pipes 32c, which are in contact with the deionized water, are formed of quartz glass or very pure fluorosis resin, the deionized water cannot be contaminated.

The present invention is not limited to the specifically disclosed embodiments, and variations and modifications may be made without departing from the scope of the present invention.

What is claimed is:

1. A system for utilization of waste heat of a semiconductor fabrication apparatus, comprising:
   a heat processing apparatus being cooled by cooling water;
   a cleaning apparatus performing a cleaning process by using heated deionized water;
   a deionized water heating apparatus heating the deionized water used by the cleaning apparatus;
   a cooling water supply line supplying cooling water to the heat processing apparatus;
   a cooling water reutilization line supplying cooling water drained from the heat processing apparatus to the deionized water heating apparatus; and
   a cooling water recovery line recovering cooling water drained from the deionized water heating apparatus,
   wherein the deionized water heating apparatus heats deionized water through heat exchange with the cooling water supplied from the cooling water reutilization line.

2. The system as claimed in claim 1, further comprising a cooling water circulation line coupling between the cooling water supply line and the cooling water recovery line.

3. The system as claimed in claim 2, further comprising circulation stop means for stopping flow of cooling water toward the cooling water circulation line when a temperature of the cooling water in the cooling water recovery line exceeds a predetermined temperature.

4. The system as claimed in claim 3, wherein the circulation stop means comprises:

a first switching valve being provided along the cooling water recovery line;

a second switching valve being provided along the cooling water circulation line; and a temperature sensor detecting a temperature of cooling water in the cooling water supply line, wherein the first switching valve is opened and the second switching valve is closed when the temperature of the cooling water detected by the temperature sensor exceeds the predetermined temperature.

5. The system as claimed in one of claims 1 through 4, wherein the deionized water heating apparatus includes a contact portion with deionized water, the contact portion being formed of one of quartz glass and fluorosis resin.

6. A method for utilization of waste heat in a semiconductor fabrication facility having a heat processing apparatus and a cleaning apparatus, the method comprising the steps of:

supplying to a deionized water heating apparatus cooling water drained from the heat processing apparatus after cooling for the heat processing apparatus;

supplying deionized water to the deionized water heating apparatus, heating the deionized water through heat exchange with the cooling water, and supplying the heated deionized water to the cleaning apparatus; and recovering the cooling water drained from the deionized water heating apparatus.

7. The method as claimed in claim 6, further comprising the step of supplying the cooling water drained from the deionized water heating apparatus to the heat processing apparatus directly.

8. The method as claimed in claim 7, further comprising the step of stopping supplying the cooling water drained from the deionized water heating apparatus to the heat processing apparatus when a temperature of the cooling water drained from the deionized water heating apparatus exceeds a predetermined temperature.

* * * * *

UNITED STATES PATENT AND TRADEMARK OFFICE
CERTIFICATE OF CORRECTION

PATENT NO. : 6,799,539 B2
DATED : October 5, 2004
INVENTOR(S) : Osamu Suenaga and Sadao Kobayashi It is certified that error appears in the above-identified patent and that said Letters Patent is hereby corrected as shown below:

<u>Title page,</u>
Item [86], PCT No., "Aug. 20, 2003" should read -- Aug. 19, 2003 --.

Signed and Sealed this

Twenty-fourth Day of May, 2005

JON W. DUDAS
*Director of the United States Patent and Trademark Office*